(12) United States Patent
Lin et al.

(10) Patent No.: US 9,991,154 B2
(45) Date of Patent: Jun. 5, 2018

(54) METHOD FOR FABRICATING A FIN FIELD EFFECT TRANSISTOR AND A SHALLOW TRENCH ISOLATION

(71) Applicant: Taiwan Semiconductor Manufacturing Co., Ltd., Hsinchu (TW)

(72) Inventors: Wei Ken Lin, Tainan (TW); Jia-Ming Lin, Tainan (TW); Hsien-Che Teng, Tainan (TW); Yung-Chou Shih, Tainan (TW); Kun-Dian She, Tainan (TW); Lichia Yang, Taipei (TW); Yun-Wen Chu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/054,113

(22) Filed: Feb. 25, 2016

(65) Prior Publication Data

US 2017/0250106 A1 Aug. 31, 2017

(51) Int. Cl.
| | |
|---|---|
| *H01L 21/76* | (2006.01) |
| *H01L 21/762* | (2006.01) |
| *H01L 21/02* | (2006.01) |
| *H01L 29/78* | (2006.01) |
| *H01L 29/66* | (2006.01) |

(52) U.S. Cl.
CPC .. *H01L 21/76224* (2013.01); *H01L 21/02236* (2013.01); *H01L 29/66795* (2013.01); *H01L 29/7848* (2013.01)

(58) Field of Classification Search
None
See application file for complete search history.

(56) References Cited

U.S. PATENT DOCUMENTS

| 2011/0111137 A1* | 5/2011 | Liang ............... C23C 16/345 427/579 |
| 2011/0151677 A1* | 6/2011 | Wang ............... H01L 21/02343 438/773 |
| 2014/0346607 A1* | 11/2014 | Ching ............. H01L 29/66795 257/369 |

* cited by examiner

*Primary Examiner* — Cory Eskridge
(74) *Attorney, Agent, or Firm* — JCIPRNET

(57) ABSTRACT

A method for fabricating a shallow trench isolation (STI) structure comprises the following steps. A silane-base precursor having a volumetric flowrate of 500 to 750 sccm and a nitrogen-base precursor having a volumetric flowrate of 300 to 600 sccm are introduced and mixed under a first pressure ranging from 0.5 to 1.5 torr at a first temperature ranging from 30 to 105 centigrade to deposit a flowable dielectric layer in a trench of a substrate. Then, ozone gas and oxygen gas are introduced and mixed under a second pressure ranging from 300 to 650 torr at a second temperature ranging from 50 to 250 centigrade to treat the flowable dielectric layer, wherein a volumetric flowrate ratio of ozone gas and oxygen gas ranges from 1:1 to 3:1. A method for fabricating a FinFET is provided.

20 Claims, 10 Drawing Sheets

METHOD FOR FABRICATING A FIN FIELD EFFECT TRANSISTOR AND A SHALLOW TRENCH ISOLATION

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

Currently, voids are often found in high-aspect-ratio shallow trench isolation (STI) structures of FinFETs. The aforesaid voids found in high-aspect-ratio STI structures may deteriorate reliability and yield rate of FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
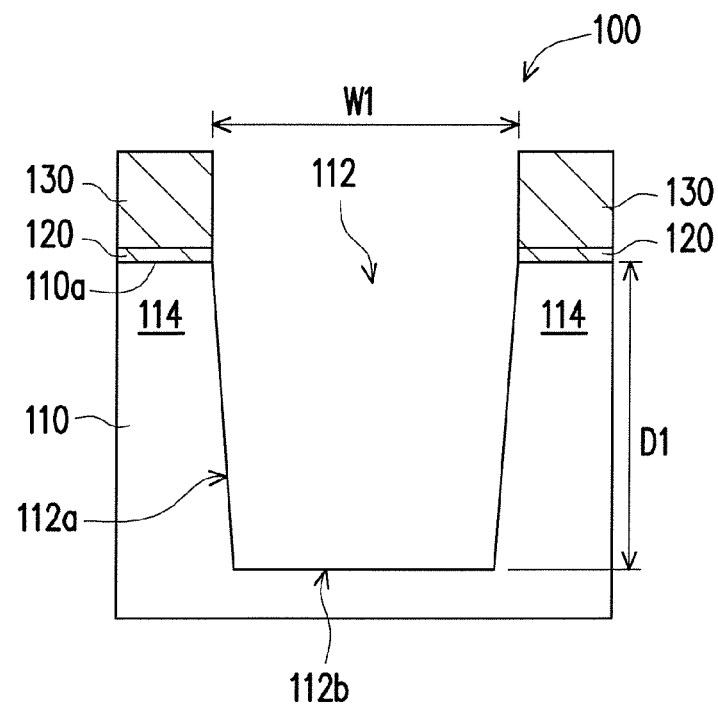
FIG. 1A to FIG. 1D are cross-sectional views of various stages of forming a STI structure in a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a void-free shallow trench isolation (STI) structure. The aforesaid "void-free" means that size and number of voids in STI structure are negligible. For example, number of voids in the void-free STI structure is less than 1 and size of the voids in the void-free STI structure is smaller than 10 nm.

In some embodiments, the void-free STI structure is implemented into MOS devices. The fabricating process of the void-free STI structure for MOS devices is described in the accompanying FIG. 1A to FIG. 1D.

FIG. 1A to FIG. 1D are cross-sectional views of various stages of forming a STI structure 100 in a substrate 110, in accordance with some embodiments. FIG. 1A shows a trench 112, which is formed in substrate 110. The trench 112 is formed by patterning (e.g. etch) the substrate 110. The substrate 110 may be bulk silicon, doped or undoped, or an active layer of a silicon on insulator (SOI) substrate. Generally, an SOI substrate includes an active layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

Referring to FIG. 1A, a patterned hard mask layer 130 and a protective layer 120 underneath are formed over a top surface 110a of the substrate 110. The protective layer 120 protects the surface 110a of the substrate 110 from direct contact with the hard mask layer 130. The protective layer 120 protects active regions 114 and the active regions 114 are used for forming devices (such as MOS devices, capacitors, resistors, etc.) after the STI structure 100 is formed in the trench 112. Depending upon the devices to be formed, the active regions 114 may comprise either an n-well or a p-well as determined by the design requirements.

In some embodiments, the protective layer 120 is made of a thermal oxide. The thickness of proactive layer 120 is in a range from about 20 nm to about 100 nm. The hard mask layer 130 assists maintaining the integrity of the patterns during etching of trench 112. In some embodiments, the hard mask layer 130 is used as a planarization stop layer during the removal of excess flowable dielectric film 160 (to be described below) that fills the trench 112. In some embodiments, the hard mask layer 130 is made of SiN. However, other materials, such as SiON, silicon carbide, or a combination thereof, may also be used. The thickness of hard mask layer 130 is in a range from about 200 nm to about 1200 nm. The hard masking layer 130 may be formed by a process such as chemical vapor deposition (CVD), plasma enhanced chemical vapor deposition (PECVD), or low pressure chemical vapor deposition (LPCVD). Alternatively, the hard mask layer 130 made be first made of a silicon oxide and then converted to SiN by nitridation. Once formed, the hard mask layer 130 and the protective layer 120 are patterned through suitable photolithographic and etching processes to form the openings over surface 110a for the trench 112.

The exposed portions of the substrate 110 through the openings are removed by an etching process, such as reactive ion etching (RIE), in order to form the trench 112 in substrate 110. The trench 112 separates active regions 114 near the top surface 110a of the substrate 110. The trench 112 has sidewalls 112a and a bottom surface 112b. In some embodiments, the trench 112 has a width W1 in a range from about 20 nm to about 48 nm and the trench 112 has a depth D1 in a range from about 40 nm to about 70 nm.

In some embodiments, an aspect ratio, the trench depth D1 (sometimes referred to herein as trench height) divided by the trench width W1, of the trench 112 is greater than about 8 or greater than 10.

Figure 1B:
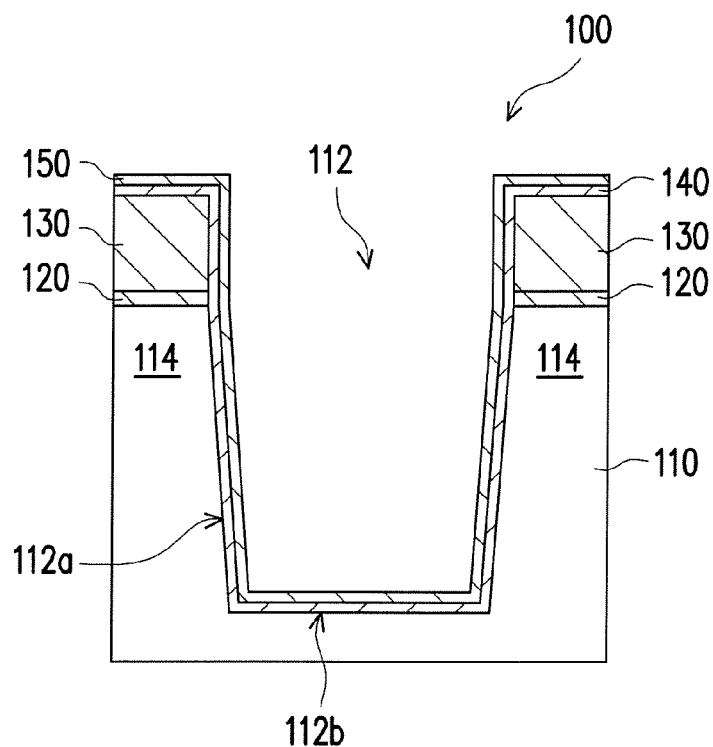

Referring to FIG. 1B, a silicon oxide liner 140 and a silicon liner 150 are deposited sequentially to line the trench 112, in accordance with some embodiments. The silicon oxide liner 140 and the silicon liner 150 are deposited on sidewalls 112a and bottom surface 112b. In some embodiments, the silicon oxide liner 140 is thermally grown on the sidewalls 112a and the bottom surface 112b of the trench 112. The substrate 110 is exposed to an oxygen-containing environment at a high temperature and the surface exposed to the oxygen is converted to silicon oxide. In some embodiments, the oxygen-containing environment includes steam. The silicon oxide liner 140 may include an additional layer or layers over the thermally grown silicon oxide layer. In some embodiments, an additional silicon oxide layer may be deposited using plasma enhanced atomic layer deposition (PEALD). According to various embodiments, the silicon oxide liner 140 is formed to protect the silicon substrate 110 underlying the silicon oxide liner 140 from subsequent oxidation. The silicon oxide liner 140 is relatively thin, in the order of tens to a hundred angstroms (A), in order to minimize an increase in the aspect of the high aspect-ratio trench 112 to be filled. In some embodiments, the thickness of the silicon oxide liner 140 is in a range from about 2 nm to about 50 nm.

Referring to FIG. 1B, a silicon liner layer 150 is deposited over the silicon oxide liner 140. The silicon liner layer 150 provides stress relief during thermal anneal(s) of the flowable dielectric layer (to be described below). In some embodiments, the silicon liner layer 150 is amorphous silicon or poly-silicon. A thickness of the silicon liner layer 150 is in a range from about 10 Å to about 40 Å. The silicon liner layer 150 may be formed by using a furnace system in a gaseous environment containing $Si_2H_6$, $SiH_4$, $Si_3H_8$, $SiCl_2H_2$, $SiCl_3H$, or a combination thereof. In some embodiments, the flowrate of $Si_2H_6$ is in the range of about 10 standard cubic centimeters per minute (sccm) to about 1000 sccm. A temperature for the formation of the silicon liner layer 150 is in a rage of about 200 centigrade to about 600 centigrade, for example. A pressure range for the formation of the silicon liner layer 150 is from about 10 mTorr to about 10 Torr, for example. Alternatively, the silicon liner layer 150 may be formed by using a deposition technique that can form a conformal silicon layer, such as the low temperature chemical vapor deposition process (CVD) in a gaseous environment containing $Si_3H_8$, $SiH_4$, $SiCl_2H_2$, $SiCl_3H$, or a combination thereof.

In some embodiments, the gas environment also comprises a carrier gas such as $H_2$. The carrier gas helps to better control treatment uniformity. In some embodiments, the flowrates of $Si_3H_8$ and $H_2$ are in the range from about 10 sccm to about 1000 sccm, and from about 5 standard liters per minute (slm) to about 50 slm, respectively. A temperature for the formation of the silicon liner layer 150 in the chemical deposition process is in a range of about 250 centigrade to 550 centigrade, for example.

Figure 1C:
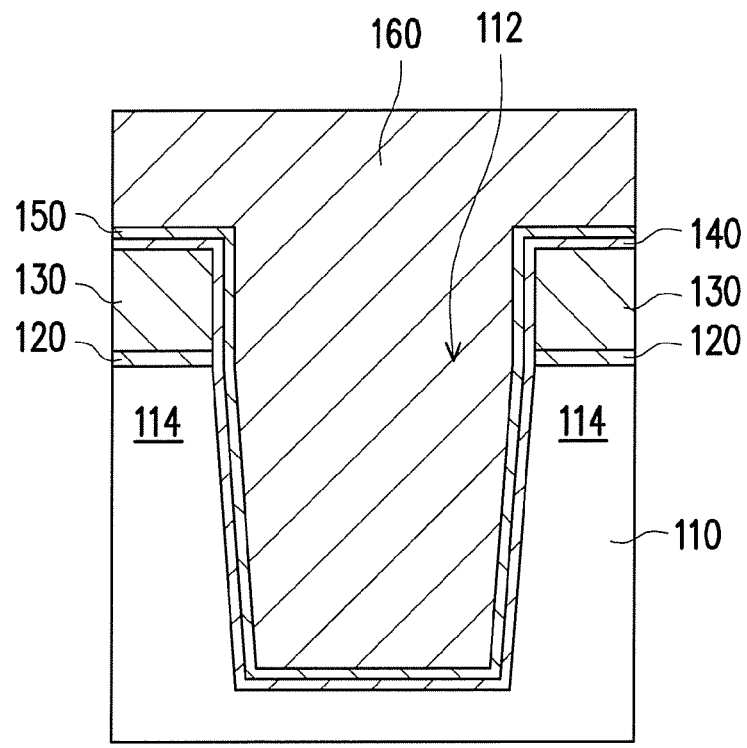

Referring to FIG. 1C, after the formation of the silicon liner layer 150, a flowable dielectric material overfills the trench 112 and covers the silicon liner layer 150 so as to form a flowable dielectric layer 160. In this embodiment, the flowable dielectric layer 160 is formed by chemical vapor deposition (CVD) process including the following steps. A silane-base precursor having a volumetric flowrate of 500 sccm to 750 sccm and a nitrogen-base precursor having a volumetric flowrate of 300 sccm to 600 sccm are introduced and mixed under a first pressure ranging from 0.5 torr to 1.5 torr at a first temperature ranging from 30 centigrade to 105 centigrade so as to deposit a flowable dielectric layer 160 in the trench 112 of a substrate 110. The flowable dielectric layer 160 is capable of flowing during deposition to diminish voids or discontinuities generated in the trench 112. For example, the silane-base precursor includes silane, trisilylamine or combinations thereof while the nitrogen-base precursor includes nitrogen gas ($N_2$), ammonia or combinations thereof. In some embodiments, the flowable dielectric layer 160 is deposited in the absence of oxidants. In alternative embodiments, the flowable dielectric layer 160 may be deposited by introducing silane-base precursor having a volumetric flowrate of 500 sccm to 750 sccm, nitrogen-base precursor having a volumetric flowrate of 300 sccm to 600 sccm and an oxidant mixed with the silane-base precursor and the nitrogen-base precursor. The oxidant is oxygen gas ($O_2$), ozone gas ($O_3$), water ($H_2O$) or combinations thereof, for example. When oxygen gas ($O_2$) is used as the oxidant, the flowrate of the oxygen gas ($O_2$) may range from 50 sccm to 400 sccm. In some embodiments, the deposition recipe of the flowable dielectric layer 160 may be modified as followings: the volumetric flowrate of the silane-base precursor ranges from 500 sccm to 600 sccm, the volumetric flowrate of the nitrogen-base precursor ranges from 450 sccm to 600 sccm, the volumetric flowrate of oxygen gas ranges from 50 sccm to 200 sccm during the flowable dielectric layer 160 is deposited, the second pressure ranges from 500 torr to 650 torr, and the second temperature ranges from 50 centigrade to 150 centigrade.

After the flowable dielectric layer 160 is deposited, ozone gas and oxygen gas are introduced and mixed under a second pressure ranging from 300 torr to 650 torr at a second temperature ranging from 50 centigrade to 250 centigrade so as to treat the deposited flowable dielectric layer 160, wherein a volumetric flowrate ratio of ozone gas and oxygen gas ranges from 1:1 to 3:1 during the flowable dielectric layer is treated. In some embodiments, the treatment recipe of the flowable dielectric layer 160 may be modified as followings: ozone gas and oxygen gas are introduced and mixed under a second pressure ranging from 500 torr to 650 torr at a second temperature ranging from 50 centigrade to 150 centigrade, wherein a volumetric flowrate ratio of ozone gas and oxygen gas ranges from 1:1 to 2:1 during the flowable dielectric layer is treated. The aforesaid mixture of ozone gas ($O_3$) and oxygen gas ($O_2$) may cure the flowable dielectric layer 160. If the flowable dielectric layer 160 is deposited in the absence of oxidants, the deposited flowable dielectric layer 160 is simultaneously oxidized and cured by the mixture of ozone gas ($O_3$) and oxygen gas ($O_2$). If the flowable dielectric layer 160 is deposited by introducing the aforesaid silane-base precursor, nitrogen-base precursor and oxidant, the deposited flowable dielectric layer 160 is already oxidized and is further cured by the mixture of ozone gas ($O_3$) and oxygen gas ($O_2$). The above-mentioned curing process may be an in-situ curing process or an ex-situ curing process. In-situ means the curing process is performed in the process chamber for depositing the flowable dielectric layer 160. In some embodiments, the curing process is performed in a different chamber (or ex-situ).

Figure 1D:
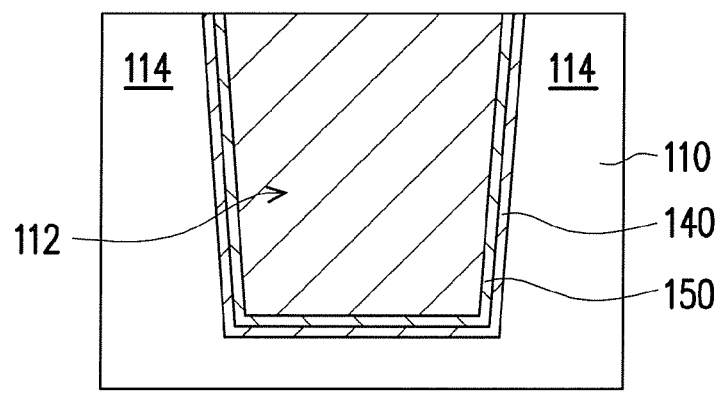

After the curing process, the cured flowable dielectric layer 160 is fully converted to $SiO_2$, a planarization process is performed to remove flowable dielectric layer 160 outside the trench 112, as shown in FIG. 1D in accordance with some embodiments. In some embodiments, the planarization process is a chemical-mechanical polishing (CMP) process. The planarization process removes portion of the flowable dielectric layer 160 outside the trench 112. In some embodiments, the planarization process also removes the hard mask layer 130, the protective layer 120, a portion of the silicon oxide liner 140 and a portion of the silicon liner 150 outside the trench 112. In some alternative embodiments, the planarization process removes the hard mask layer 130; however, the protective layer 120 is removed by an etching process.

In some alternative embodiments, the above-mentioned void-free STI structure is implemented into FinFETs. The fabricating process of the void-free STI structure for FinFETs is described in the accompanying FIG. 2A to FIG. 2H.

The embodiments of the present disclosure describe the exemplary fabricating process of FinFETs. The FinFETs may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Figure 2A:
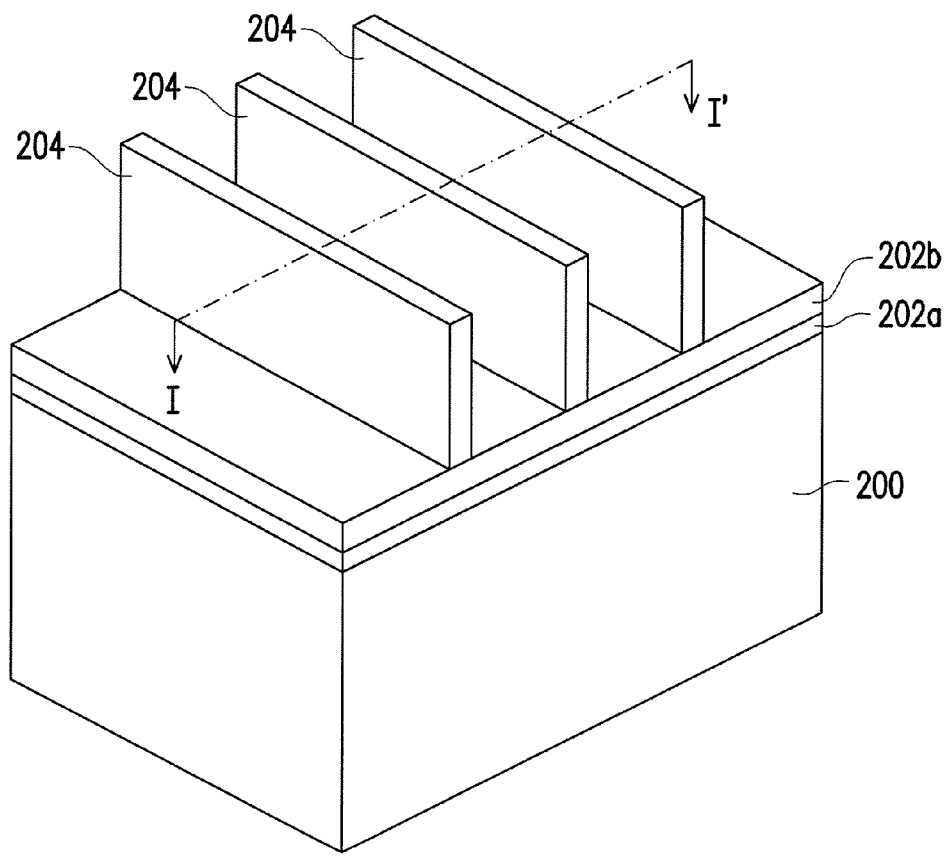
FIGS. 2A-2H are perspective views of a method for fabricating a FinFET in accordance with some embodiments.
Figure 3A:
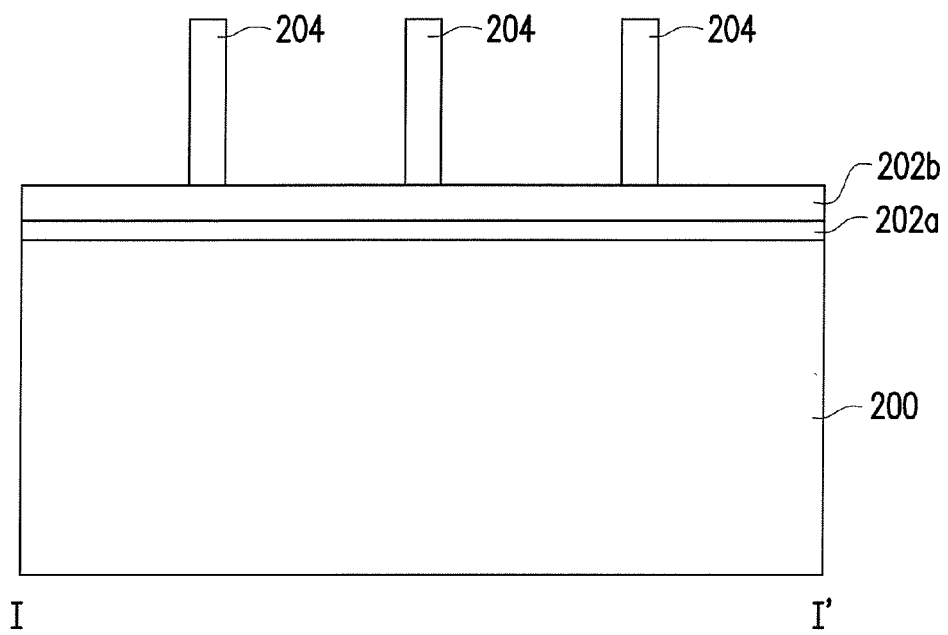
FIGS. 3A-3H are cross-sectional views of a method for fabricating a FinFET in accordance with some embodiments.

FIG. 2A is a perspective view of the FinFET at one of various stages of the manufacturing method, and FIG. 3A is a cross-sectional view of the FinFET taken along the line I-I' of FIG. 2A. As shown in FIG. 2A and FIG. 3A, a substrate 200 is provided. In one embodiment, the substrate 200 comprises a crystalline silicon substrate (e.g., wafer). The substrate 200 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a protective layer 202a and a hard mask layer 202b are sequentially formed on the substrate 200. The protective layer 202a may be a silicon oxide thin film formed, for example, by thermal oxidation process. The protective layer 202a may act as an adhesion layer between the substrate 200 and hard mask layer 202b. The protective layer 202a may also act as an etch stop layer for etching the hard mask layer 202b. In at least one embodiment, the hard mask layer 202b is a silicon nitride layer formed, for example, by low-pressure chemical vapor deposition (LP-CVD) or plasma enhanced chemical vapor deposition (PECVD). The hard mask layer 202b is used as a hard mask during subsequent photolithography processes. A patterned photoresist layer 204 having a predetermined pattern is formed on the hard mask layer 202b.

Figure 2B:
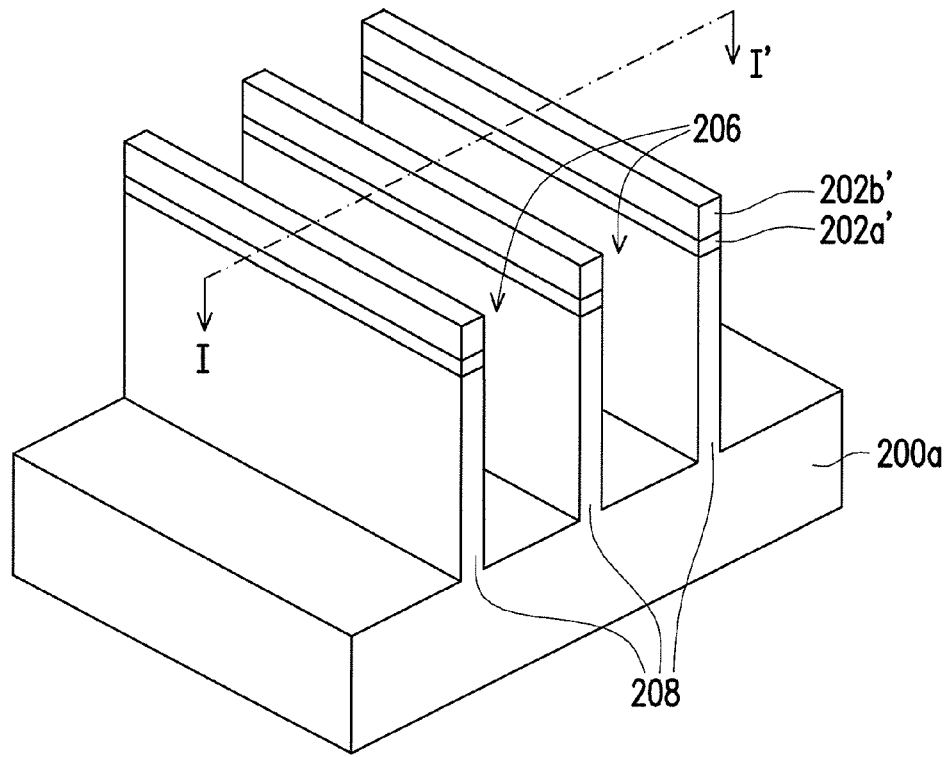
Figure 3B:
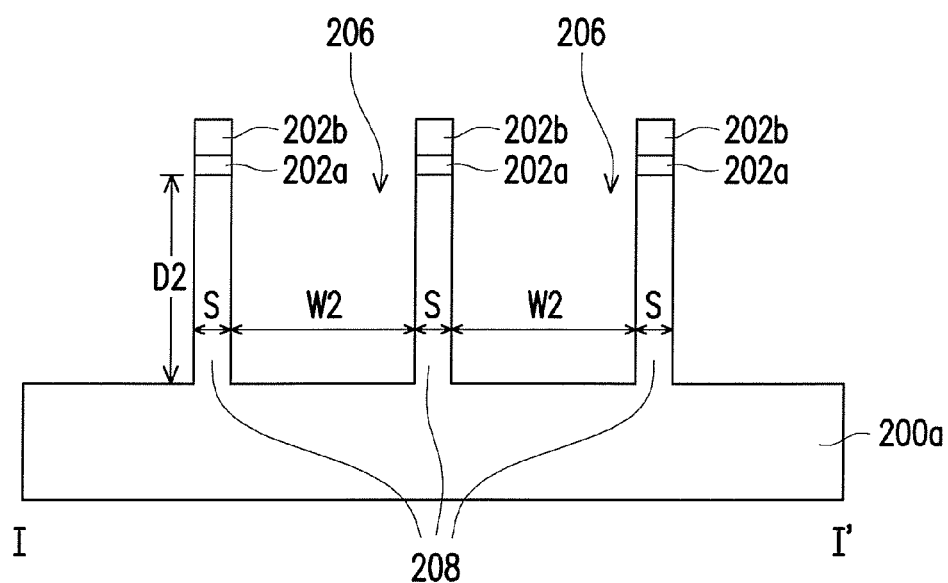

FIG. 2B is a perspective view of the FinFET at one of various stages of the manufacturing method, and FIG. 3B is a cross-sectional view of the FinFET taken along the line I-I' of FIG. 2B. As shown in FIGS. 2A-2B and FIGS. 3A-3B, the hard mask layer 202b and the protective layer 202a which are not covered by the patterned photoresist layer 204 are sequentially etched to form a patterned hard mask layer 202b' and a patterned protective layer 202a' so as to expose underlying substrate 200. By using the patterned hard mask layer 202b', the patterned protective layer 202a' and the patterned photoresist layer 204 as a mask, portions of the substrate 200 are exposed and etched to form trenches 206 and semiconductor fins 208. The semiconductor fins 208 are covered by the patterned hard mask layer 202b', the patterned protective layer 202a' and the patterned photoresist layer 204. Two adjacent trenches 206 are spaced apart by a spacing S. For example, the spacing S between the trenches 206 may be smaller than about 30 nm. In other words, two adjacent trenches 206 are spaced apart by a corresponding semiconductor fin 208.

In some embodiments, each of the trenches 206 has a width W2 in a range from about 20 nm to about 48 nm. The height of the semiconductor fins 208 and the depth of the trench 206 range from about 40 nm to about 70 nm, for example. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 2C:
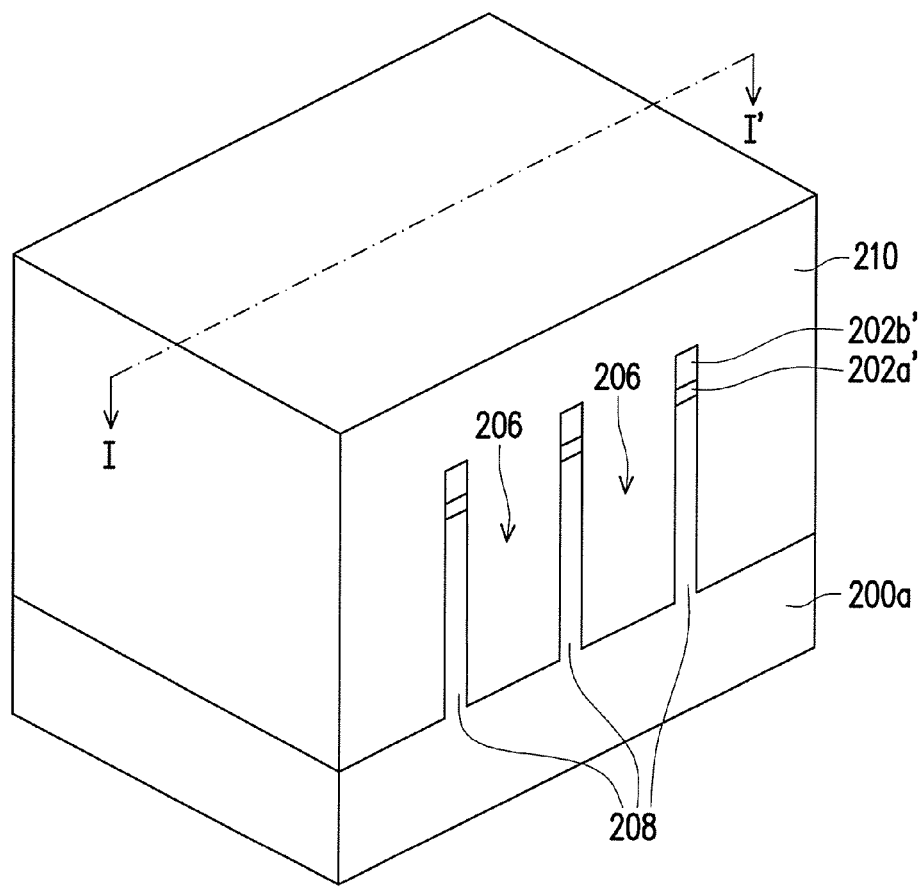
Figure 3C:
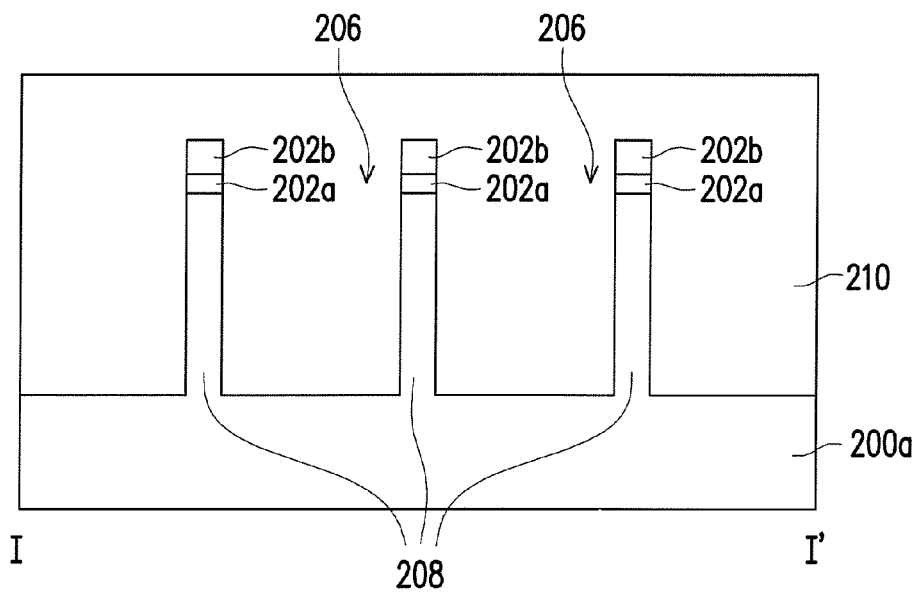

FIG. 2C is a perspective view of the FinFET at one of various stages of the manufacturing method, and FIG. 3C is a cross-sectional view of the FinFET taken along the line I-I' of FIG. 2C. As shown in FIGS. 2B-2C and FIGS. 3B-3C, after the trenches 206 and the semiconductor fins 208 are formed, a flowable dielectric material overfills the trench 206 and covers the semiconductor fins 208 so as to form a flowable dielectric layer 210. In this embodiment, the flowable dielectric layer 210 is formed by chemical vapor deposition (CVD) process including the following steps. A silane-base precursor having a volumetric flowrate of 500 sccm to 750 sccm and a nitrogen-base precursor having a volumetric flowrate of 300 sccm to 600 sccm are introduced and mixed under a first pressure ranging from 0.5 torr to 1.5 torr at a first temperature ranging from 30 centigrade to 105 centigrade so as to deposit a flowable dielectric layer 210 in the trench 206 of a substrate 200a. The flowable dielectric layer 210 is capable of flowing during deposition to diminish voids or discontinuities generated in the trench 206. For example, the silane-base precursor includes silane, trisilylamine or combinations thereof while the nitrogen-base precursor includes nitrogen gas ($N_2$), ammonia or combinations thereof. In some embodiments, the flowable dielectric layer 210 is deposited in the absence of oxidants. In alternative embodiments, the flowable dielectric layer 210 may be deposited by introducing silane-base precursor having a volumetric flowrate of 500 sccm to 750 sccm, nitrogen-base precursor having a volumetric flowrate of 300 sccm to 600 sccm and an oxidant mixed with the silane-base precursor and the nitrogen-base precursor. The oxidant is oxygen gas ($O_2$), ozone gas ($O_3$), water ($H_2O$) or combinations thereof, for example. When oxygen gas ($O_2$) is used as the oxidant, the flowrate of the oxygen gas ($O_2$) may range from 50 sccm to 400 sccm. In some embodiments, the deposition recipe of the flowable dielectric layer 210 may be modified as followings: the volumetric flowrate of the silane-base precursor ranges from 500 sccm to 600 sccm, the volumetric flowrate of the nitrogen-base precursor ranges from 450 sccm to 600 sccm, the volumetric flowrate of oxygen gas ranges from 50 sccm to 200 sccm during the flowable dielectric layer 210 is deposited, the second pressure ranges from 500 torr to 650 torr, and the second temperature ranges from 50 centigrade to 150 centigrade.

After the flowable dielectric layer 210 is deposited, ozone gas and oxygen gas are introduced and mixed under a second pressure ranging from 300 torr to 650 torr at a second temperature ranging from 50 centigrade to 250 centigrade so as to treat the deposited flowable dielectric layer 210, wherein a volumetric flowrate ratio of ozone gas and oxygen gas ranges from 1:1 to 3:1 during the flowable dielectric layer is treated. In some embodiments, the treatment recipe of the flowable dielectric layer 210 may be modified as followings: ozone gas and oxygen gas are introduced and mixed under a second pressure ranging from 500 torr to 650 torr at a second temperature ranging from 50 centigrade to 150 centigrade, wherein a volumetric flowrate ratio of ozone gas and oxygen gas ranges from 1:1 to 2:1 during the flowable dielectric layer is treated. The aforesaid mixture of ozone gas ($O_3$) and oxygen gas ($O_2$) may cure the flowable dielectric layer 210. If the flowable dielectric layer 210 is deposited in the absence of oxidants, the deposited flowable dielectric layer 210 is simultaneously oxidized and cured by the mixture of ozone gas ($O_3$) and oxygen gas ($O_2$). If the flowable dielectric layer 210 is deposited by introducing the aforesaid silane-base precursor, nitrogen-base precursor and oxidant, the deposited flowable dielectric layer 210 is already oxidized and is further cured by the mixture of ozone gas ($O_3$) and oxygen gas ($O_2$). The above-mentioned curing process may be an in-situ curing process or an ex-situ curing process. In-situ means the curing process is performed in the process chamber for depositing the flowable dielectric layer 210. In some embodiments, the curing process is performed in a different chamber (or ex-situ).

As shown in FIG. 2C and FIG. 3C, in addition to the semiconductor fins 208, flowable dielectric layer 210 further covers the patterned protective layer 202a' and the patterned hard mask layer 202b'.

Figure 2D:
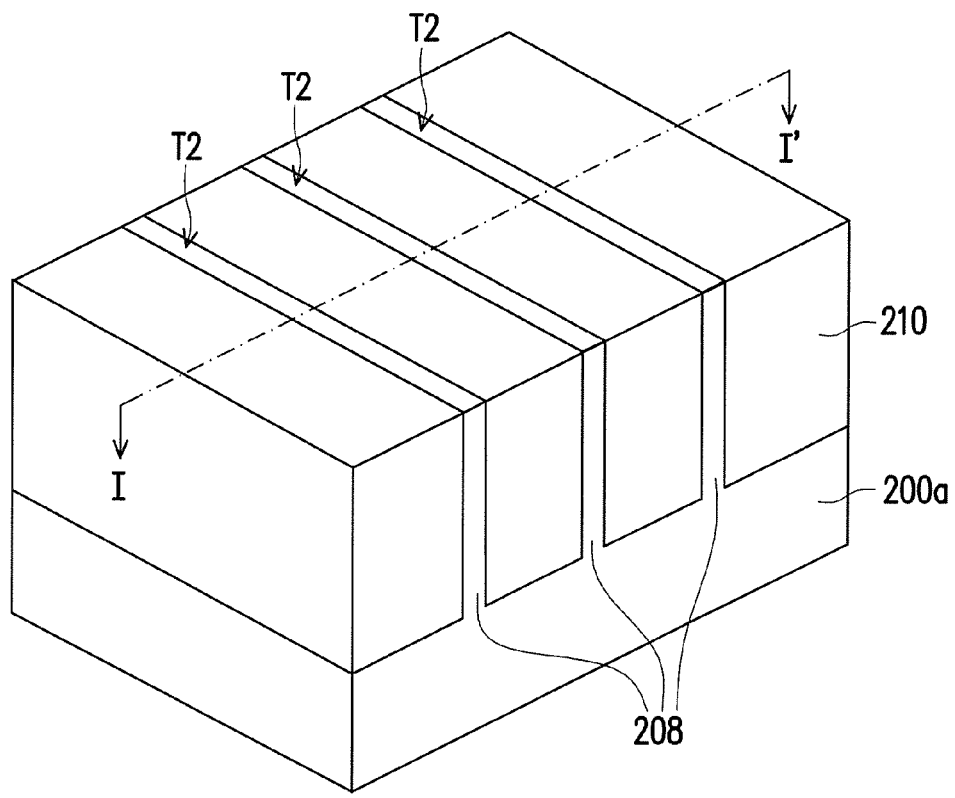
Figure 3D:
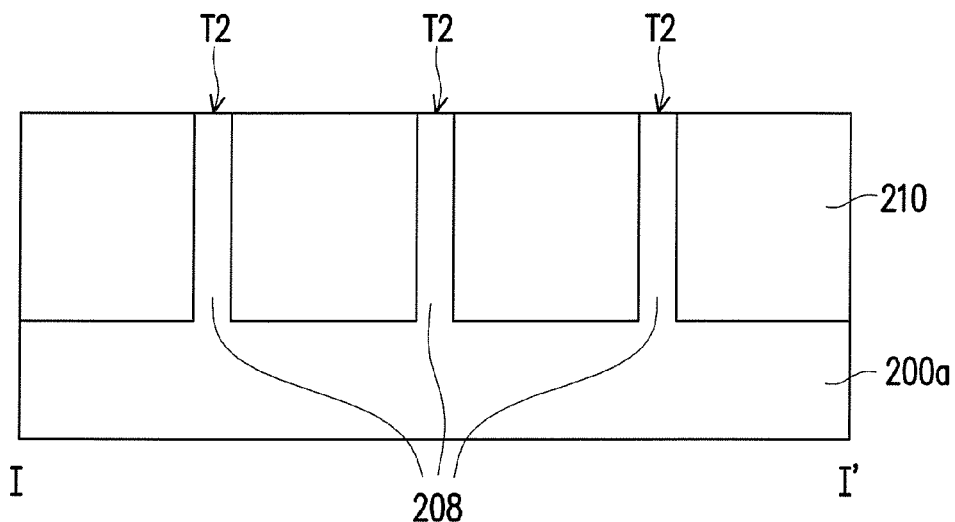

FIG. 2D is a perspective view of the FinFET at one of various stages of the manufacturing method, and FIG. 3D is a cross-sectional view of the FinFET taken along the line I-I' of FIG. 2D. As shown in FIGS. 2C-2D and FIGS. 3C-3D, a chemical mechanical polish process is, for example, performed to remove a portion of the flowable dielectric layer 210, the patterned hard mask layer 202b' and the patterned protective layer 202a' until the semiconductor fins 208 are exposed. As shown in FIG. 2D and FIG. 3D, after the flowable dielectric layer 210 is polished, top surfaces of the polished flowable dielectric layer 210 is substantially coplanar with top surface T2 of the semiconductor fins.

Figure 2E:
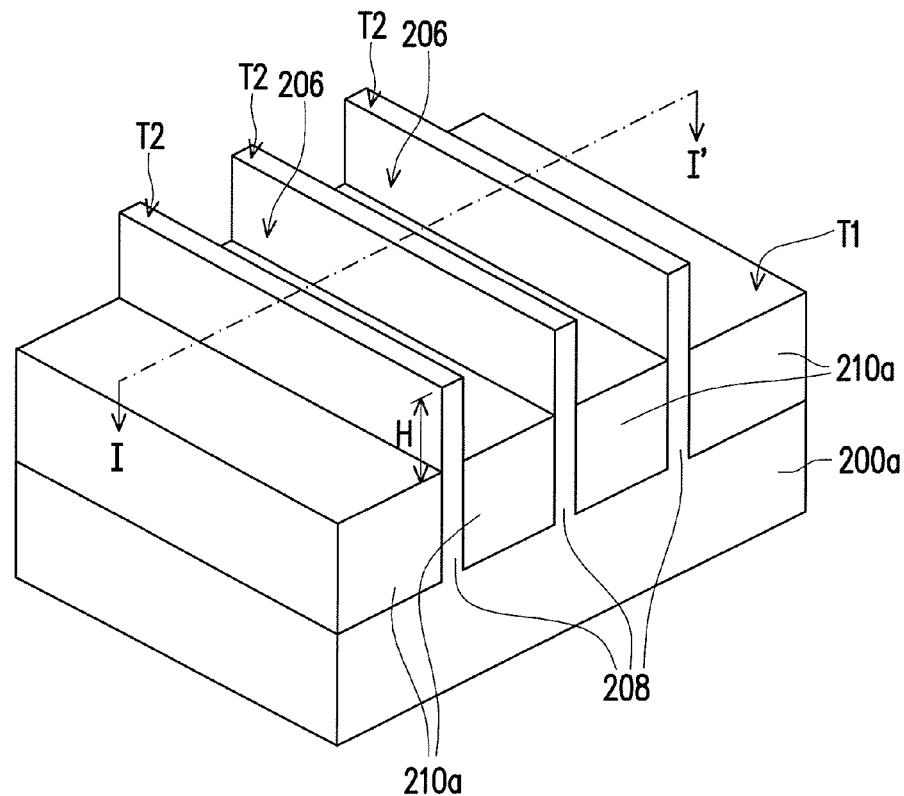
Figure 3E:
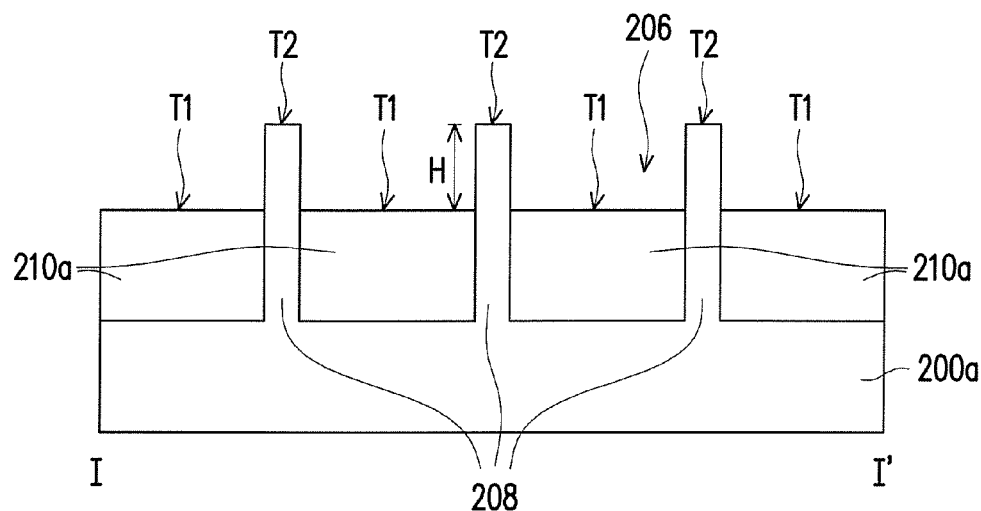

FIG. 2E is a perspective view of the FinFET at one of various stages of the manufacturing method, and FIG. 3E is a cross-sectional view of the FinFET taken along the line I-I' of FIG. 2E. As shown in FIGS. 2D-2E and FIGS. 3D-3E, the polished flowable dielectric layer 210 filled in the trenches 206 is partially removed by an etching process such that insulators 210a (e.g. STI structure) are formed between the semiconductor fins 208. In one embodiment, the etching process may be a wet etching process with hydrofluoric acid (HF) or a dry etching process. The top surfaces T1 of the insulators 210a are lower than the top surfaces T2 of the semiconductor fins 208. The semiconductor fins 208 protrude from the top surfaces T1 of the insulators 210a. The height difference between the top surfaces T2 of the fins 208 and the top surfaces T1 of the insulators 210a is H, and the height difference H ranges from about 15 nm to about 50 nm.

Figure 2F:
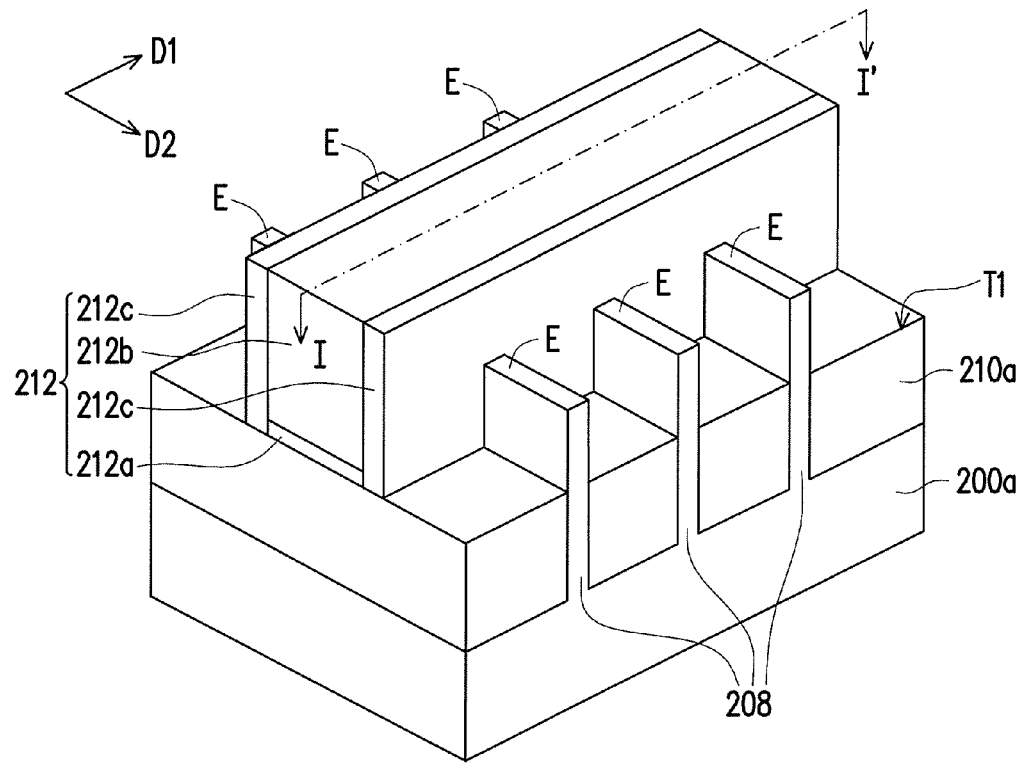
Figure 3F:
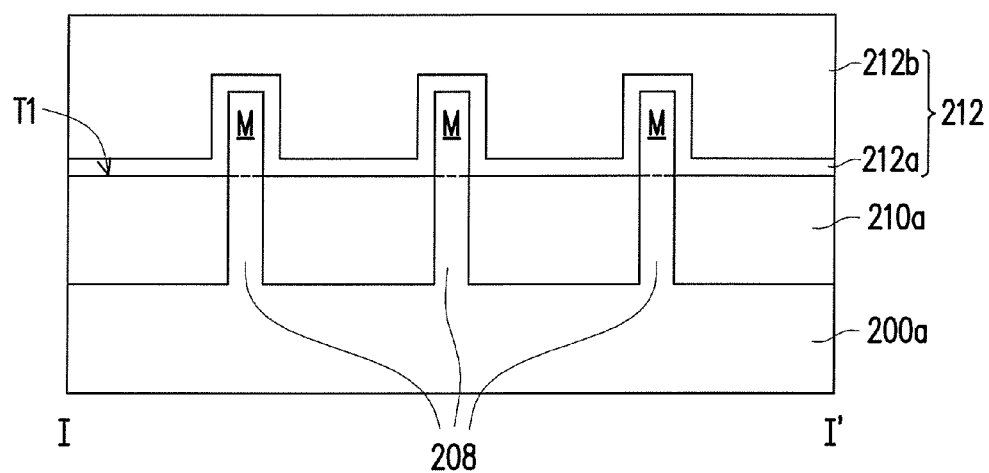

FIG. 2F is a perspective view of the FinFET at one of various stages of the manufacturing method, and FIG. 3F is a cross-sectional view of the FinFET taken along the line I-I' of FIG. 2F. As shown in FIGS. 2E-2F and FIGS. 2F-3F, a gate stack 212 is formed over portions of the semiconductor fins 208 and portion of the insulators 210a. In one embodiment, the extending direction D1 of the gate stack 212 is, for example, perpendicular to the extension direction D2 of the semiconductor fins 208 so as to cover the middle portions M (shown in FIG. 3F) of the semiconductor fins 208. The aforesaid middle portions M may act as channels of the tri-gate FinFET. The gate stack 212 comprises a gate dielectric layer 212a and a gate electrode layer 212b disposed over the gate dielectric layer 212a. The gate dielectric layer 212b is disposed over portions of the semiconductor fins 208 and over portions of the insulators 210a.

The gate dielectric 212a is formed to cover the middle portions M of the semiconductor fins 208. In some embodiments, the gate dielectric layer 212a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 212a is a high-k dielectric layer with a thickness in the range of about 10 to 30 angstroms. The gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212a may further comprise an interfacial layer (not shown) to reduce damage between the gate dielectric layer 212a and semiconductor fins 208. The interfacial layer may comprise silicon oxide.

The gate electrode layer 212b is then formed on the gate dielectric layer 212a. In some embodiments, the gate electrode layer 212b may comprise a single layer or multi-layered structure. In some embodiments, the gate electrode layer 212b may comprise poly-silicon or metal, such as Al, Cu, W, Ti, Ta, TiN, TiAl, TiAlN, TaN, NiSi, CoSi, other conductive materials with a work function compatible with the substrate material, or combinations thereof. In some embodiments, the gate electrode layer 212b includes a silicon-containing material, such as poly-silicon, amorphous silicon or a combination thereof, and is formed prior to the formation of the strained material 214. In alternative embodiments, the gate electrode layer 212b is a dummy gate, and a metal gate (or called "replacement gate") replaces the dummy gate after the strain strained material 214 (shown in FIG. 2H) is formed. In some embodiments, the gate electrode layer 212b comprises a thickness in the range of about 30 nm to about 60 nm. The gate electrode layer 212b may be formed using a suitable process such as ALD, CVD, PVD, plating, or combinations thereof.

In addition, the gate stack 212 may further comprise a pair of spacers 212c disposed on sidewalls of the gate dielectric layer 212a and the gate electrode layer 212b. The pair of spacer 212c may further cover portions of the semiconductor fins 208. The spacers 212c are formed of dielectric materials, such as silicon nitride or SiCON. The spacers 212c may include a single layer or multilayer structure. Portions of the semiconductor fins 208 that are not covered by the gate stack 212 are referred to as exposed portions E hereinafter.

Figure 2G:
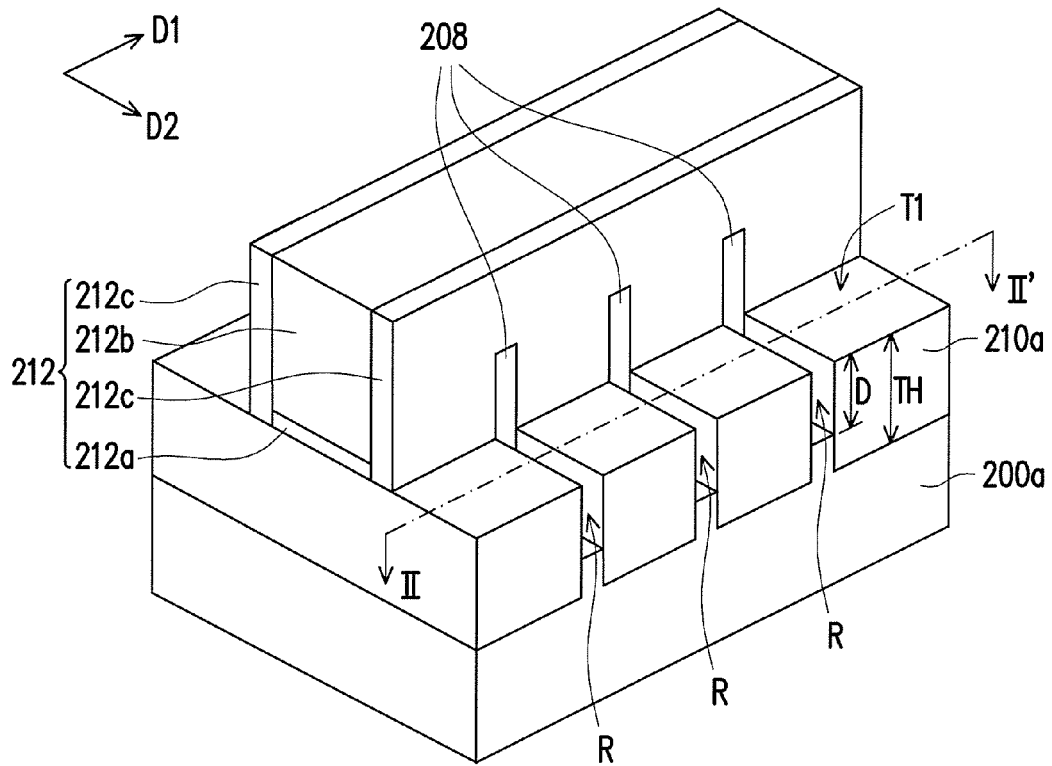
Figure 3G:
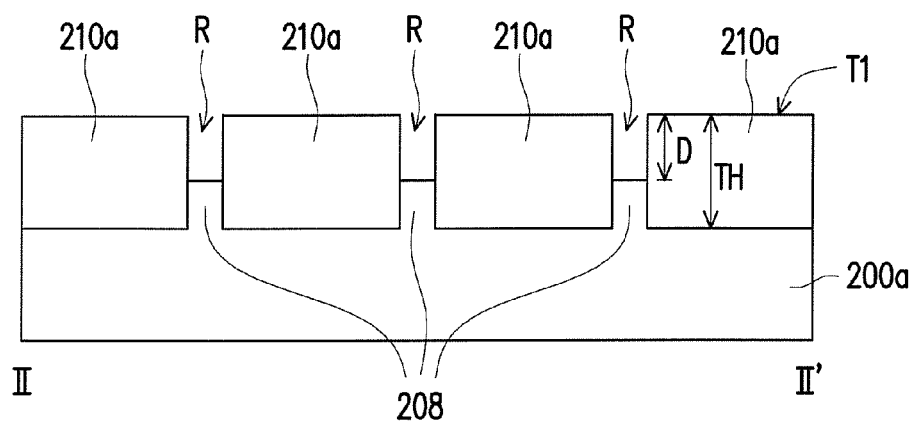

FIG. 2G is a perspective view of the FinFET at one of various stages of the manufacturing method, and FIG. 3G is a cross-sectional view of the FinFET taken along the line II-II' of FIG. 2G. As shown in FIGS. 2F-2G and FIGS. 3F-3G, the exposed portions E of the semiconductor fins 208 are removed and recessed to formed recessed portions R. For example, the exposed portions E are removed by anisotropic etching, isotropic etching or the combination thereof. In some embodiments, the exposed portions E of the semiconductor fins 208 are recessed below the top surfaces T1 of the insulators 210a. The depth D of the recessed portions R is less than the thickness TH of the insulators 210a. In other words, the exposed portions E of the semiconductor fins 208 are not entirely removed. As show in FIG. 2G and FIG. 3G, portions of the semiconductor fins 208 covered by the gate stack 212 is not removed when the exposed portions E of the semiconductor fins 208 are recessed. The portions of the semiconductor fins 208 covered by the gate stack 212 are exposed at sidewalls of the gate stack 212.

Figure 2H:
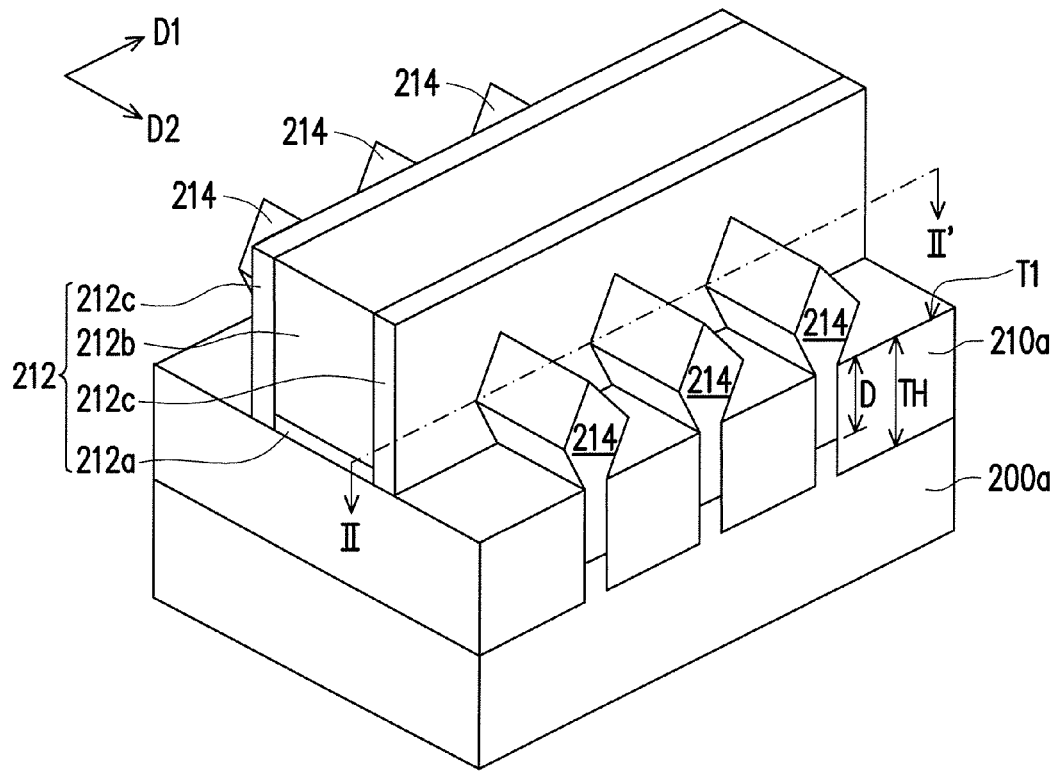
Figure 3H:
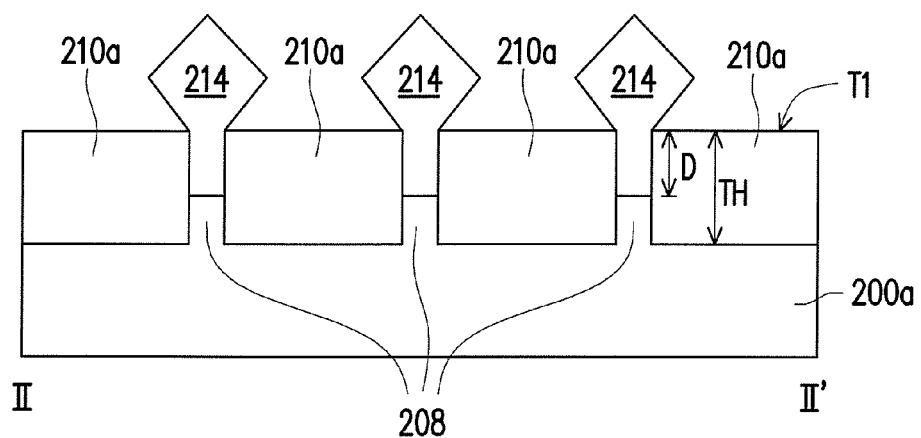

FIG. 2H is a perspective view of the FinFET at one of various stages of the manufacturing method, and FIG. 3H is a cross-sectional view of the FinFET taken along the line II-II' of FIG. 2H. As shown in FIGS. 2G-2H and FIGS. 2G-3H, a strained material 214 is selectively grown over the recessed portions R of the semiconductor fin 208 and extends beyond the top surfaces T1 of the insulators 210a to strain or stress the semiconductor fins 208. The strained material 214 comprises sources disposed at a side of the stack gate 212 and drains disposed at the other side of the gate stack 212. The sources cover an end of the semiconductor fins 208 and the drains cover the other end of the semiconductor fin 208.

In some embodiments, the strained material 214, such as silicon carbon (SiC), is epitaxial-grown by a LPCVD process to form the sources and drains of the n-type FinFET. In alternative embodiments, the strained material 214, such as silicon germanium (SiGe), is epitaxial-grown by a LPCVD process to form the sources and drains of the p-type FinFET.

In some embodiments, due to novel recipes of deposition and curing processes are proposed in this disclosure, the fabricated void-free STI structures or void-free insulators enhance reliability and yield rate of MOS devices or FinFETs.

In accordance with some embodiments of the present disclosure, a method for fabricating a shallow trench isolation (STI) structure comprises the following steps. A silane-base precursor having a volumetric flowrate of 500 sccm to 750 sccm and a nitrogen-base precursor having a volumetric flowrate of 300 sccm to 600 sccm are introduced, wherein the silane-base precursor and the nitrogen-base precursor are mixed under a first pressure ranging from 0.5 torr to 1.5 torr at a first temperature ranging from 30 centigrade to 105 centigrade so as to deposit a flowable dielectric layer in a trench of a substrate. Then, ozone and oxygen are introduced and mixed under a second pressure ranging from 300 torr to 650 torr at a second temperature ranging from 50 centigrade to 250 centigrade so as to treat the flowable dielectric layer, wherein a volumetric flowrate ratio of ozone and oxygen ranges from 1:1 to 3:1 during the flowable dielectric layer is treated.

In accordance with alternative embodiments of the present disclosure, a method for fabricating a shallow trench isolation (STI) structure comprises the following steps. A flowable dielectric layer is deposited in a trench of a substrate by introducing a silane-base precursor having a volumetric flowrate of 500 sccm to 750 sccm and a nitrogen-base precursor having a volumetric flowrate of 300 sccm to 600 sccm, the silane-base precursor and the nitrogen-base precursor being mixed under a first pressure ranging from 0.5 torr to 1.5 torr at a first temperature ranging from 30 centigrade to 105 centigrade. Supply of the silane-base precursor and the nitrogen-base precursor is then discontinued. Afterward, the flowable dielectric layer is cured by introducing ozone and oxygen mixed under a second pressure ranging from 300 torr to 650 torr at a second temperature ranging from 50 centigrade to 250 centigrade, wherein a volumetric flowrate ratio of ozone and oxygen ranges from 1:1 to 3:1.

In accordance with yet alternative embodiments of the present disclosure, a method for fabricating a fin field effect transistor (FinFET) comprises the following steps. First, a substrate is patterned to form trenches in the substrate and semiconductor fins between the trenches. A silane-base precursor having a volumetric flowrate of 500 sccm to 750 sccm and a nitrogen-base precursor having a volumetric flowrate of 300 sccm to 600 sccm are introduced, wherein the silane-base precursor and the nitrogen-base precursor are mixed under a first pressure ranging from 0.5 torr to 1.5 torr at a first temperature ranging from 30 centigrade to 105 centigrade to deposit a flowable dielectric layer in a trench of a substrate. Ozone and oxygen are introduced and mixed under a second pressure ranging from 300 torr to 650 torr at a second temperature ranging from 50 centigrade to 250 centigrade to treat the flowable dielectric layer, wherein a volumetric flowrate ratio of ozone and oxygen ranges from 1:1 to 3:1 during the flowable dielectric layer is treated. The flowable dielectric layer is partially removed to form a plurality of insulators. Then, a gate stack is formed over portions of the semiconductor fins and over portions of the insulators. Afterward, a strained material is formed over portions of the semiconductor fins revealed by the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a shallow trench isolation (STI) structure, comprising:
   introducing a silane-base precursor having a volumetric flowrate of 500 sccm to 750 sccm and a nitrogen-base precursor having a volumetric flowrate of 300 sccm to 600 sccm, the silane-base precursor and the nitrogen-base precursor being mixed under a first pressure ranging from 0.5 torr to 1.5 torr at a first temperature ranging from 30 centigrade to 105 centigrade to deposit a flowable dielectric layer in a trench of a substrate, wherein a width of the trench ranges from about 20 nm to about 48 nm and a depth of the trench ranges from about 40 nm to about 70 nm; and
   introducing ozone gas and oxygen gas mixed under a second pressure ranging from 300 torr to 650 torr at a second temperature ranging from 50 centigrade to 250 centigrade to treat the flowable dielectric layer, wherein a volumetric flowrate ratio of ozone gas and oxygen gas ranges from 1:1 to 3:1 during the flowable dielectric layer is treated.

2. The method of claim 1, further comprising:
introducing an oxidant mixed with the silane-base precursor and the nitrogen-base precursor during the flowable dielectric layer is deposited.

3. The method of claim 2, wherein the oxidant comprises oxygen gas, ozone gas, water or combinations thereof.

4. The method of claim 2, wherein the oxidant is oxygen gas having a volumetric flowrate of 50 sccm to 400 sccm.

5. The method of claim 4, wherein the volumetric flowrate of the silane-base precursor ranges from 500 sccm to 600 sccm, the volumetric flowrate of the nitrogen-base precursor ranges from 450 sccm to 600 sccm, the volumetric flowrate of oxygen gas ranges from 50 sccm to 200 sccm during the flowable dielectric layer is deposited, the second pressure ranges from 500 torr to 650 torr, and the second temperature ranges from 50 centigrade to 150 centigrade.

6. The method of claim 1, wherein the flowable dielectric layer is deposited in the absence of oxidants.

7. The method of claim 1 further comprising:
partially removing of the flowable dielectric layer after the flowable dielectric layer is treated by ozone gas and oxygen gas.

8. A method for fabricating a shallow trench isolation (STI) structure, comprising:
depositing a flowable dielectric layer in a trench of a substrate by introducing a silane-base precursor having a volumetric flowrate of 500 sccm to 750 sccm and a nitrogen-base precursor having a volumetric flowrate of 300 sccm to 600 sccm, the silane-base precursor and the nitrogen-base precursor being mixed under a first pressure ranging from 0.5 torr to 1.5 torr at a first temperature ranging from 30 centigrade to 105 centigrade, wherein a width of the trench ranges from about 20 nm to about 48 nm and a depth of the trench ranges from about 40 nm to about 70 nm;
discontinuing supply of the silane-base precursor and the nitrogen-base precursor; and
curing the flowable dielectric layer by introducing ozone gas and oxygen gas mixed under a second pressure ranging from 300 torr to 650 torr at a second temperature ranging from 50 centigrade to 250 centigrade, wherein a volumetric flowrate ratio of ozone gas and oxygen gas ranges from 1:1 to 3:1.

9. The method of claim 8 further comprising:
introducing an oxidant mixed with the silane-base precursor and the nitrogen-base precursor during the flowable dielectric layer is deposited.

10. The method of claim 9, wherein the oxidant comprises oxygen gas, ozone gas, water or combinations thereof.

11. The method of claim 9, wherein the oxidant is oxygen gas having a volumetric flowrate of 50 sccm to 400 sccm.

12. The method of claim 11, wherein the volumetric flowrate of the silane-base precursor ranges from 500 sccm to 600 sccm, the volumetric flowrate of the nitrogen-base precursor ranges from 450 sccm to 600 sccm, the volumetric flowrate of oxygen gas ranges from 50 sccm to 200 sccm during deposition of the flowable dielectric layer, the second pressure ranges from 500 torr to 650 torr, and the second temperature ranges from 50 centigrade to 150 centigrade.

13. The method of claim 8, wherein the flowable dielectric layer is deposited in the absence of oxidants.

14. The method of claim 8 further comprising:
partially removing the cured flowable dielectric layer.

15. A method for fabricating a fin field effect transistor (FinFET), comprising:
patterning a substrate to form trenches in the substrate and semiconductor fins between the trenches;
introducing a silane-base precursor having a volumetric flowrate of 500 sccm to 750 sccm and a nitrogen-base precursor having a volumetric flowrate of 300 sccm to 600 sccm, the silane-base precursor and the nitrogen-base precursor being mixed under a first pressure ranging from 0.5 torr to 1.5 torr at a first temperature ranging from 30 centigrade to 105 centigrade to deposit a flowable dielectric layer in the trenches of a substrate, wherein a width of the trenches ranges from about 20 nm to about 48 nm and a depth of the trenches ranges from about 40 nm to about 70 nm;
introducing ozone gas and oxygen gas mixed under a second pressure ranging from 300 torr to 650 torr at a second temperature ranging from 50 centigrade to 250 centigrade to treat the flowable dielectric layer, wherein a volumetric flowrate ratio of ozone gas and oxygen gas ranges from 1:1 to 3:1 during the flowable dielectric layer is treated;
partially removing the flowable dielectric layer to form a plurality of insulators;
forming a gate stack over portions of the semiconductor fins and over portions of the insulators; and
forming a strained material over portions of the semiconductor fins revealed by the gate stack.

16. The method of claim 15 further comprising:
introducing an oxidant mixed with the silane-base precursor and the nitrogen-base precursor during the flowable dielectric layer is deposited.

17. The method of claim 16, wherein the oxidant comprises oxygen gas, ozone gas, water or combinations thereof.

18. The method of claim 16, wherein the oxidant is oxygen gas having a volumetric flowrate of 50 sccm to 400 sccm.

19. The method of claim 18, wherein the volumetric flowrate of the silane-base precursor ranges from 500 sccm to 600 sccm, the volumetric flowrate of the nitrogen-base precursor ranges from 450 sccm to 600 sccm, the volumetric flowrate of oxygen gas ranges from 50 sccm to 200 sccm during deposition of the flowable dielectric layer, the second pressure ranges from 500 torr to 650 torr, and the second temperature ranges from 50 centigrade to 150 centigrade.

20. The method of claim 15, wherein the flowable dielectric layer is deposited in the absence of oxidants.

* * * * *